United States Patent
Hasegawa et al.

(10) Patent No.: US 7,092,533 B1
(45) Date of Patent: Aug. 15, 2006

(54) BTL AMPLIFIER APPARATUS

(75) Inventors: Tatsuzo Hasegawa, Saitama (JP); Haruyuki Inohana, Saitama (JP); Akio Ozawa, Saitama (JP)

(73) Assignee: Pioneer Corporation, Tokyo (JP)

( * ) Notice: Subject to any disclaimer, the term of this patent is extended or adjusted under 35 U.S.C. 154(b) by 0 days.

(21) Appl. No.: 09/453,525

(22) Filed: Dec. 3, 1999

(30) Foreign Application Priority Data

Dec. 4, 1998   (JP)   ................. 10-345185

(51) Int. Cl.
    *H04B 15/00*   (2006.01)
(52) U.S. Cl. .................. 381/94.5; 381/120; 381/55
(58) Field of Classification Search .......... 381/96, 381/104, 117, 106, 55, 74.5, 94.5; 330/51, 330/294, 297, 262, 251
    See application file for complete search history.

(56) References Cited

U.S. PATENT DOCUMENTS

| 3,959,735 | A | * | 5/1976 | GrosJean | 330/207 P |
| 4,301,330 | A | * | 11/1981 | Trump | 381/55 |
| 4,414,514 | A | * | 11/1983 | Seki et al. | 330/262 |
| 4,752,744 | A | * | 6/1988 | Aoki | 330/252 |
| 5,097,225 | A | * | 3/1992 | Boezen et al. | 330/298 |
| 5,206,912 | A | | 4/1993 | Noro | 381/96 |
| 5,834,977 | A | * | 11/1998 | Maehara et al. | 330/297 |
| 5,939,938 | A | * | 8/1999 | Kalb et al. | 330/51 |

FOREIGN PATENT DOCUMENTS

EP    0 736 970 A1   10/1996

* cited by examiner

*Primary Examiner*—Sinh Tran
*Assistant Examiner*—Andrew Graham
(74) *Attorney, Agent, or Firm*—Sughrue Mion, PLLC

(57) ABSTRACT

A BTL amplifying apparatus has two power amplifiers in an BTL configuration for amplifying a speaker. It includes detection means for detecting a differential voltage between outputs from the two power amplifiers while an input signal to be supplied to the power amplifiers is muted, and decision means for deciding whether or not the differential voltage is larger than a prescribed voltage. Such a configuration prevent the speaker from being damaged.

3 Claims, 8 Drawing Sheets

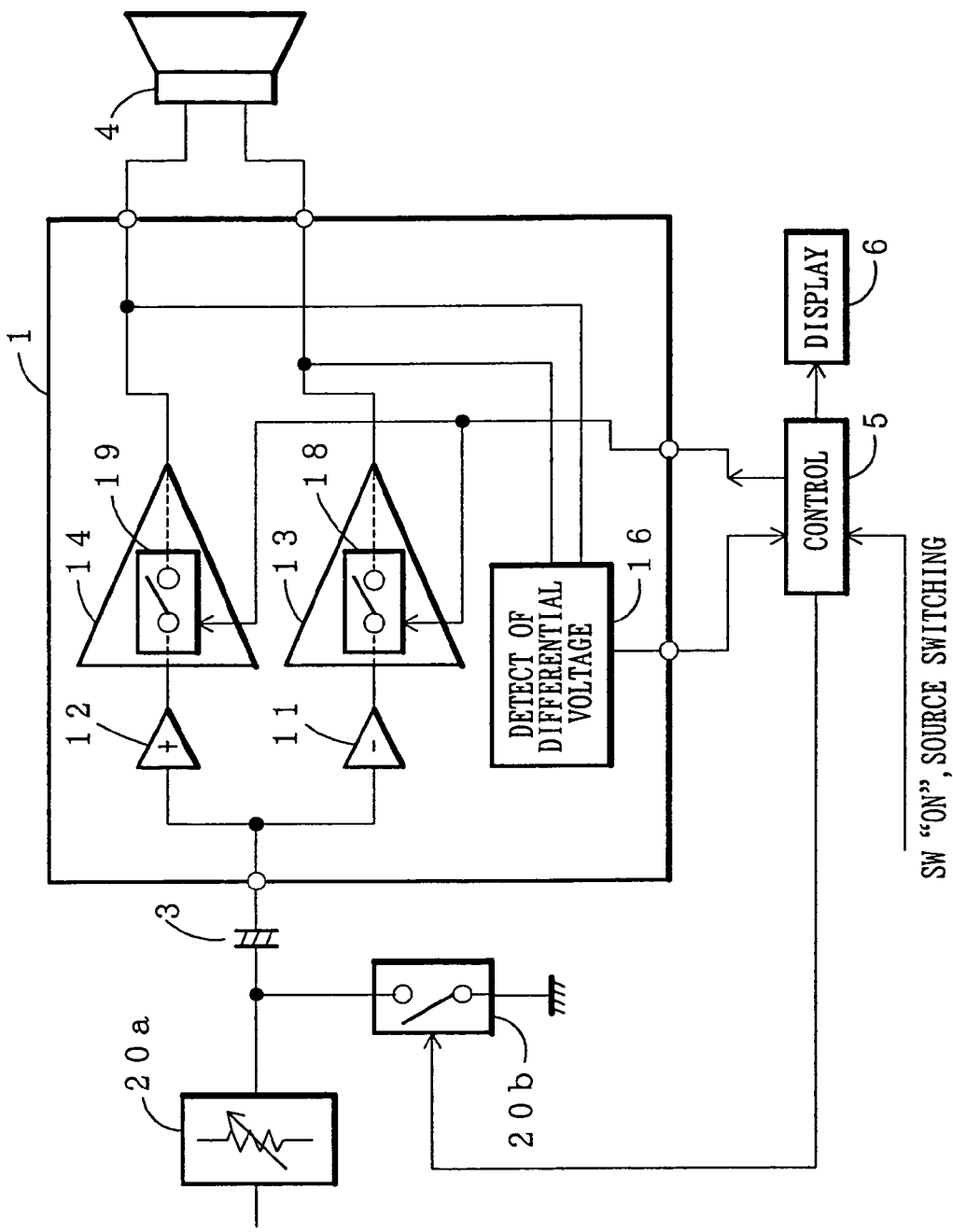
F I G. 5

BTL AMPLIFIER APPARATUS

BACKGROUND OF THE INVENTION

1. Field of the Invention

The present invention relates to a BTL (Balanced Transformer Less) amplifier apparatus for driving a speaker.

2. Description of the Related Art

Generally, the BTL amplifier has various advantages: (1) a high output is obtained from a low power supply voltage, (2) distortion at even order is canceled; (3) the amount of ripple rejection of the power supply is much. For this reason, it has been widely used in an audio system for a vehicle.

FIG. 9 shows a typical conventional BTL amplifier 1 formed in an integrated circuit. The BTL amplifier 1 includes an inverting amplifier 11 for inverting an input signal and amplifiers 13 and 14 each having a gain equal to that of the inverting amplifier 11.

Reference numeral 2 denotes an electronic volume, 3 a coupling capacitor and 4 a speaker.

Nowadays, the BTL amplifier 1 and electronic volume 2 are designed in a semiconductor integrated circuit in which they are DC-coupled with a capacitor and coil removed in order to maintain the preferred characteristic in a low frequency range and high frequency range.

Therefore, there is a DC potential difference between the output of the electronic volume 2 and an input of the BTL amplifier 1. If the electronic volume 2 and BTL amplifier 1 are connected to each other with such a potential difference, the respective circuits do not operate normally. In order to obviate such an inconvenience, a capacitor 3 is connected for coupling the output from the electronic volume 2 with the BTL amplifier.

However, if the capacitor 3 is deteriorated to generate a leak current and the BTL amplifier 1 is deteriorated, a DC current flows through a voice coil of a speaker so that the voice coil may be damaged by the generated distortion.

SUMMARY OF THE INVENTION

An object of the present invention is to provide an improved BTL amplifier apparatus which will not damage the voice coil of a speaker.

In order to attain the above object, in accordance with the present invention, there is provided a BTL amplifying apparatus having two power amplifiers in an BTL configuration for amplifying a speaker, comprising: detection means for detecting a differential voltage between outputs from said two power amplifiers while an input signal to be supplied to said power amplifiers is muted, and decision means for deciding whether or not the differential voltage is larger than a prescribed voltage.

Preferably, the BTL amplifying apparatus further comprises volume means for adjusting a signal level of the input signal; and means for muting the input signal to be supplied from the volume to the power amplifiers during a prescribed period.

In the BTL amplifying apparatus, preferably, the detection means and the decision means are operated when a power switch is turned on and a signal source is switched.

In accordance with the present invention, since the differential voltage is detected to provide a DC offset while the input signal is not supplied to the power amplifiers, using a decision result of the difference voltage, it is possible to prevent a voice coil of the speaker from being damaged.

In accordance with the present invention, the period while the input signal to be supplied to the power amplifiers is muted can be set when it is required to provide the DC offset. During the period, the detection and decision can be carried so that a sense of discomfort is not given to listeners.

The above and other objects and features of the present invention will be more apparent from the following description taken in conjunction with the accompanying drawings.

BRIEF DESCRIPTION OF THE DRAWINGS

FIG. 5 is a block diagram of a fourth embodiment of the BTL amplifier according to the present invention;

DESCRIPTION OF THE PREFERRED EMBODIMENTS

Figure 1:
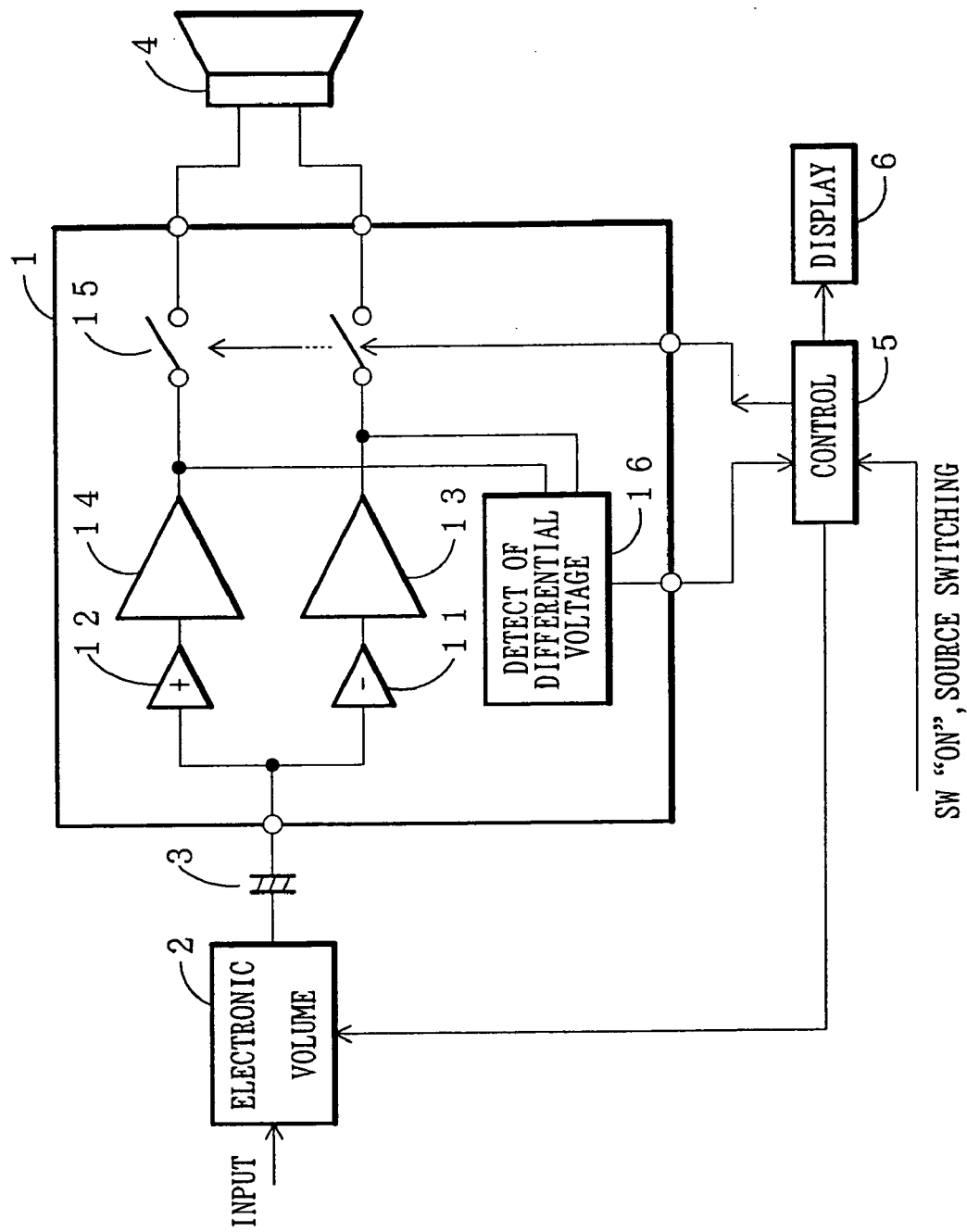
FIG. 1 is a block diagram showing the configuration of the first embodiment of the BTL amplifier apparatus according to the present invention.
Figure 2:
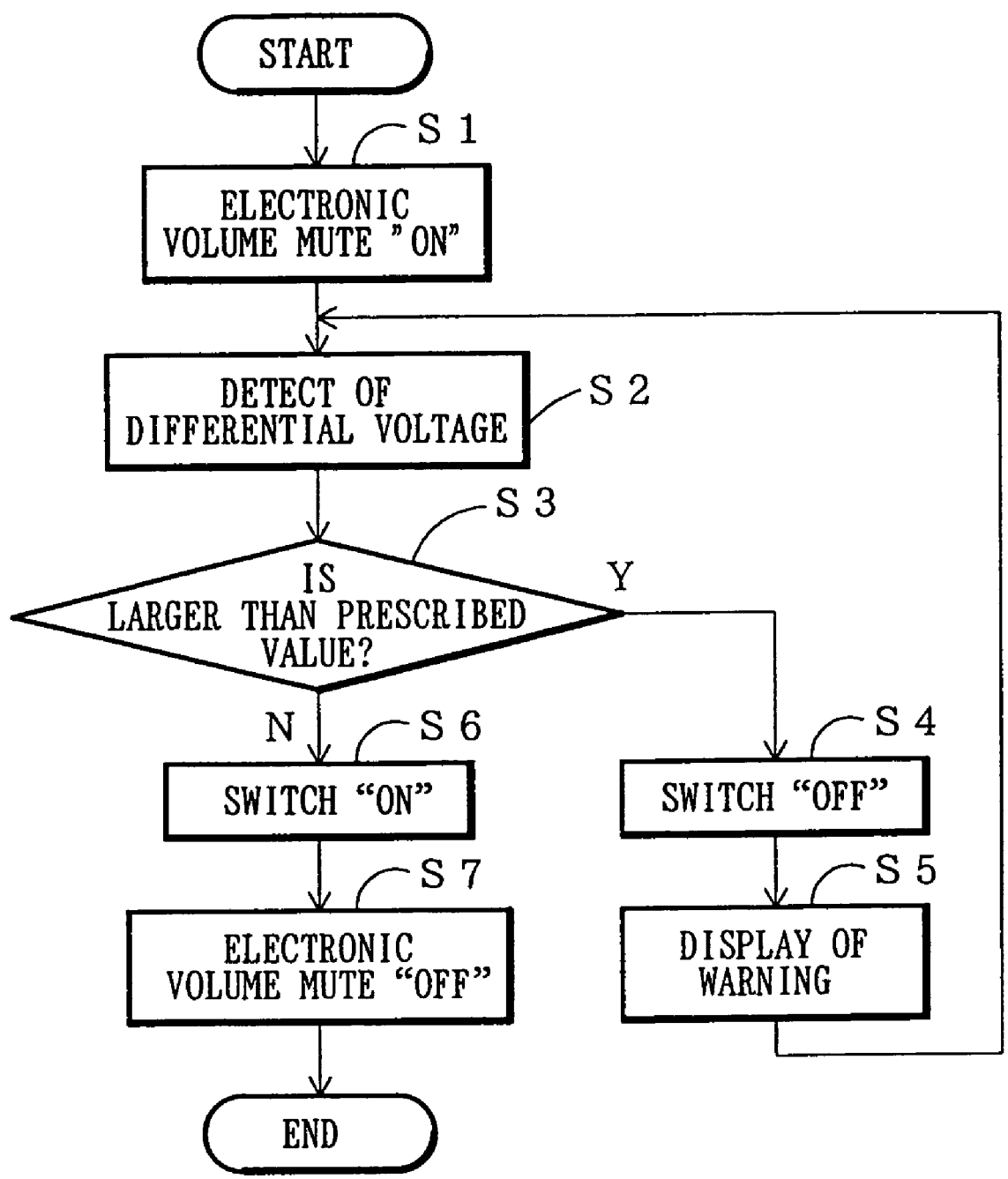
FIG. 2 is a flowchart showing the operation of the first embodiment.
Figure 3:
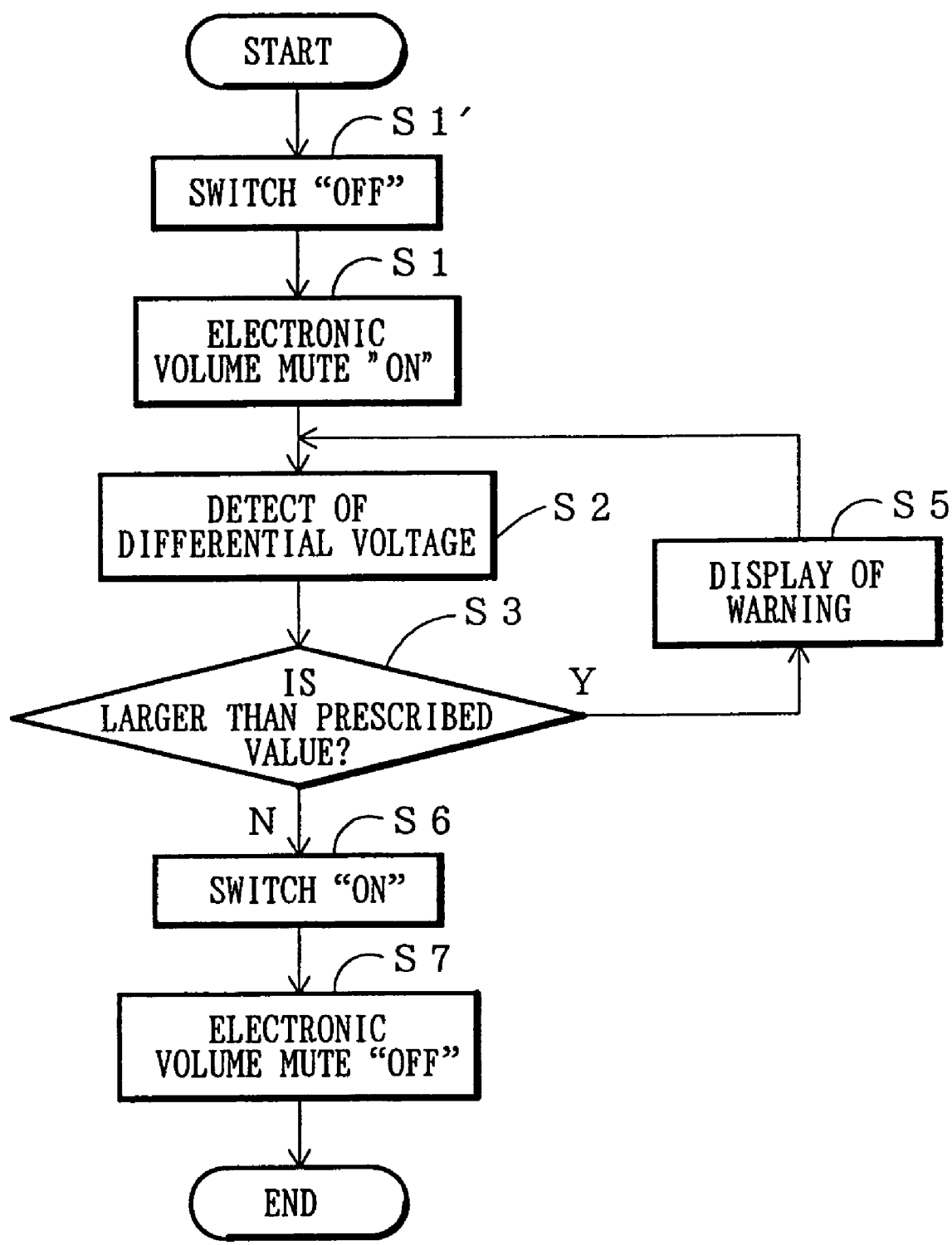
FIG. 3 is a flowchart showing the operation of the second embodiment of the BTL amplifier apparatus according to the present invention.

Now referring to FIGS. 1–3, an explanation will be given of embodiments of the present invention FIG. 1 is a basic block diagram of a first embodiment of the BTL amplifier apparatus according to the present invention. FIG. 2 is a flowchart showing the operation of the first embodiment of the present invention. FIG. 3 is a flowchart showing the operation of the BTL amplifier according to the second embodiment of the present invention.

In FIG. 1, an integrated circuit (BTL amplifier) 1, an electronic volume 2, a capacitor 3, a speaker 4, an inverting amplifier 11, an amplifier 12, and power amplifiers 13 and 14 are the same as the corresponding components in FIG. 5 showing the prior art.

Further, in FIG. 1, reference numeral 5 denotes a control unit, and reference numeral 6 denotes a display. Within the integrated circuit 1, switches 15 are provided between the power amplifiers 13, 14 and output terminals. A differential voltage detecting section 16 is also provided in order to detect a difference between the output voltages from the power amplifiers 13 and 14.

Referring to FIG. 2, an explanation will be given of the operation of the first embodiment of the BTL amplifying apparatus according to the present invention.

When a power switch turns on, a signal source is switched, or a command is issued as necessary, the operation starts.

In step S1, a control unit 5 sends a command of "muting" to the electronic volume 2 to make the output therefrom zero.

In step S2, the control unit 5 reads the differential voltage detected by the differential voltage detecting unit 16.

Now, since the audio signal is not supplied from the electronic volume 2, the control unit 5 produces the difference between the DC voltages from the power amplifiers 13 and 14, i.e. DC offset.

In step S3, the control unit 5 decides whether or not the differential voltage read in step S2 is larger than a prescribed value. If the answer is "YES", the processing proceeds to step S4. If the answer is "NO", the processing proceeds to step S6.

In step S4, the control unit 5 issues a command of turning off the switch 15. Then, the power amplifiers 13, 14 are disconnected from the connecting terminals.

In step S5, the control unit 5 causes the display unit 6 to indicate a warning. Thereafter, the processing returns to step S2. The processing from S2 to S5 is repeated.

In step S6, the control unit 5 issues a command of turning on the switches 15. Then, the power amplifiers 13 and 14 are connected to the speaker 4 through the connecting terminals.

In step S7, the control unit 5 issues a command of "muting-off" to the electronic volume 2. Then, the processing is ended.

Referring to FIG. 3, an explanation will be given of the operation of the second embodiment of the present invention. The circuit arrangement according to the second invention is the same as that of the first embodiment.

In FIG. 3, steps S1–S3 and S5–S7 are the same as those shown in FIG. 2.

In the second embodiment, step S4 in the first embodiment is canceled. Instead of this, step S1' is added before step S1.

In step S1', when the power switch turns on or the signal source is switched, the control unit 5 issues a command of turning off the switches 15.

If the switches 15 are previously turned off in this way, even when an excessive voltage is generated between the outputs from both power amplifies owing to some causes, it is possible to prevent the voice coil of the speaker 4 from being damaged.

Figure 4:
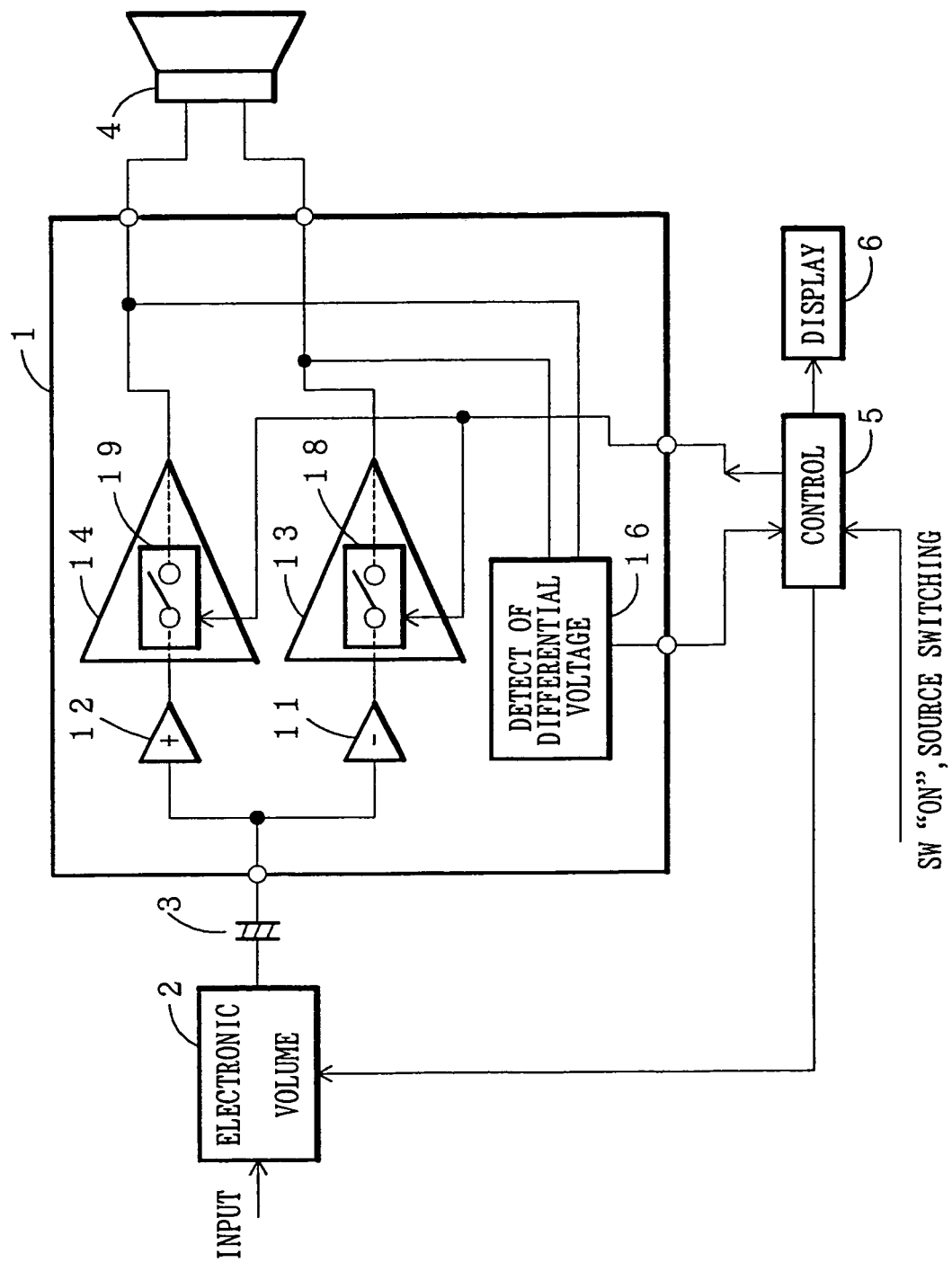
FIG. 4 is a block diagram of a third embodiment of the BTL amplifier according to the present invention.

FIG. 4 shows the configuration of third embodiment of the BTL amplifier apparatus according to the present invention. In this embodiment, the power amplifiers 13 and 14 are provided with activation/deactivation circuits 18 and 19 for activating or deactivating these power amplifiers, respectively. Each activation/deactivation circuit is constructed as a switch for turning on/off the signal passing through the power amplifier or so as to control the supply of a power source voltage to the power amplifier.

In this embodiment, when it is decided that the differential voltage is larger than a prescribed value, the activation/deactivation circuits 18, 19 deactivate the power amplifiers 13, 14 so that the signals are not supplied to the speaker 4.

FIG. 5 shows the configuration of fourth embodiment of the BTL amplifier apparatus according to the present invention.

In this embodiment, as seen from FIG. 5, the electronic volume 2 in FIG. 4 is replaced by a common mechanical volume 20a and a switch 20b connected to the output from the volume 20a.

In operation, in step S1, the switch 20b is turned on by the control unit 5 so that the signal from the volume 20a is muted. Thereafter, the DC offset is decided in the same processing as described with reference to the previous embodiments described above. It should be noted that the mechanical volume 20a and the switch 20b may be applied to the first embodiment as shown in FIG. 1.

In each of the embodiments described above, although the control unit 5 is provided outside the integrated circuit 1, it may be provided within the integrated circuit 1. The decision means in step S3 in the control unit 5 may be separately provided within the integrated circuit 1.

Figure 6:
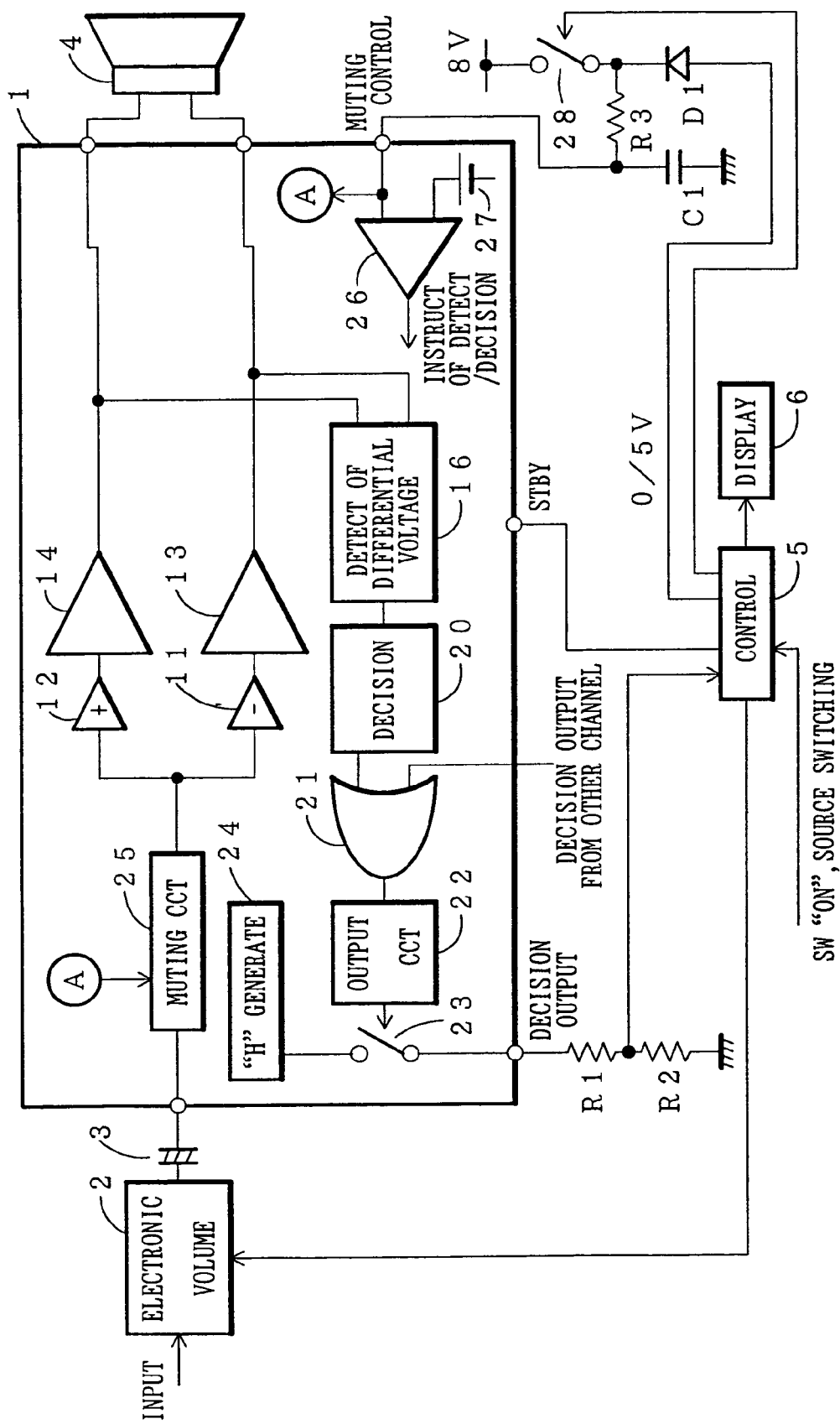
FIG. 6 is a block diagram of a fifth embodiment of the BTL amplifier according to the present invention.
Figure 7:
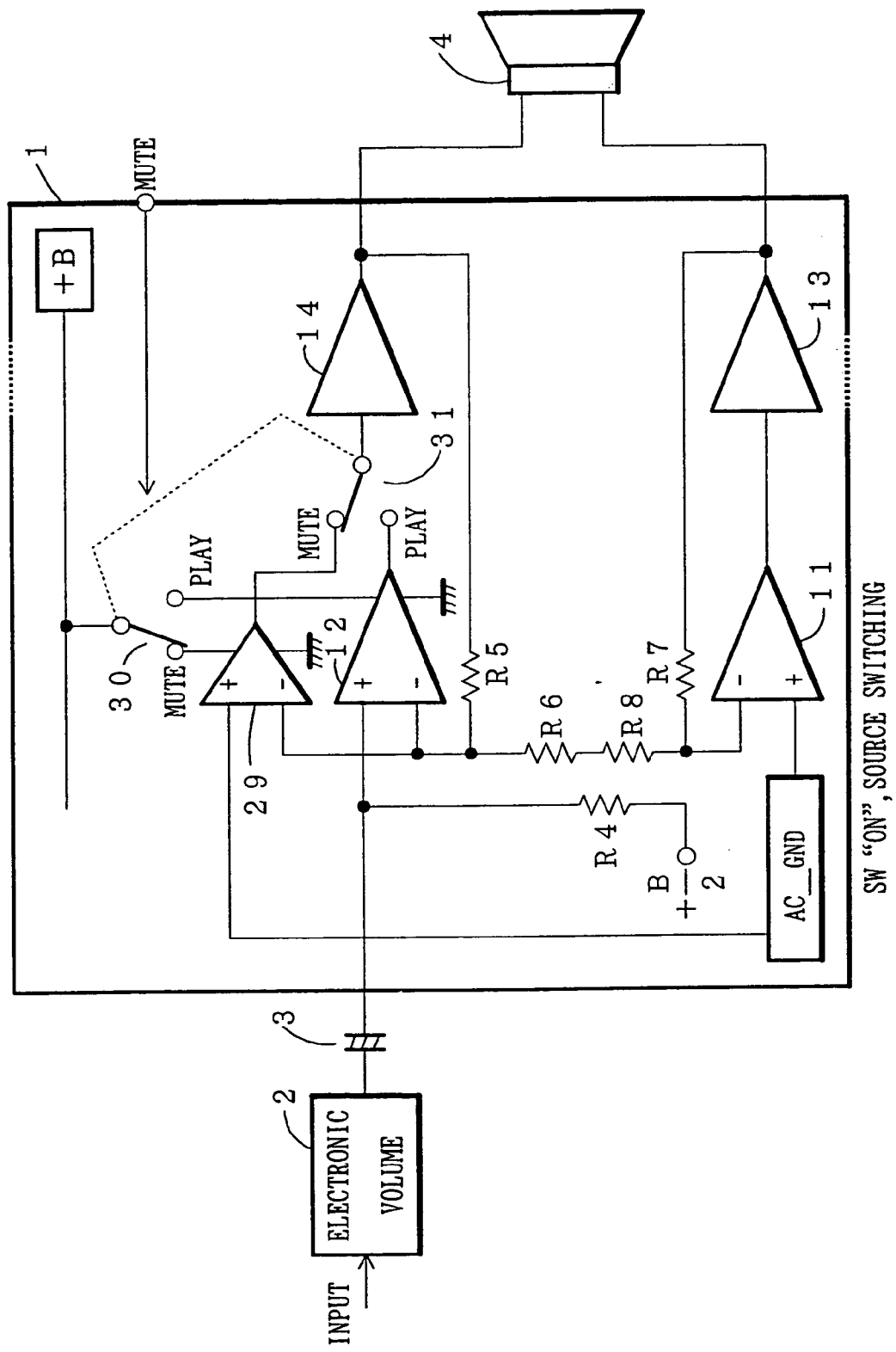
FIG. 7 is a block diagram of an embodiment of a mute circuit according to the present invention.

FIGS. 6 and 7 show the configuration of the fifth embodiment of the BTL amplifier according to the present invention. In FIGS. 6 and 7, like reference numerals refer to like components in FIGS. 1, 4 and 5.

In FIG. 6, the integrated circuit 1 is provided with terminals for a standby (STBY) input, a mute control input and a decision output. The output from the differential voltage detecting unit 16 drives the switch 23 through a decision unit 20, OR unit 21 and an output circuit 22. A "H" generating source 24 is connected to the decision output terminal through the switch 23. The voltage from the decision output terminal is divided by resistors R1 and R2 so that the resultant voltage is supplied to the control unit 5. A mute circuit 25 serves to mute the input signal to be supplied to the power amplifiers 13, 14. FIG. 7 shows a concrete arrangement of the mute circuit 25. A comparator 26 serves to compare the voltage applied to the mute control input with a reference voltage 27. According to the comparison result, the above deciding operation is carried out. A switch 28, diode D1, resistor R3 and capacitor C1 serve to set the voltage to be applied to the mute control input.

Figure 8:
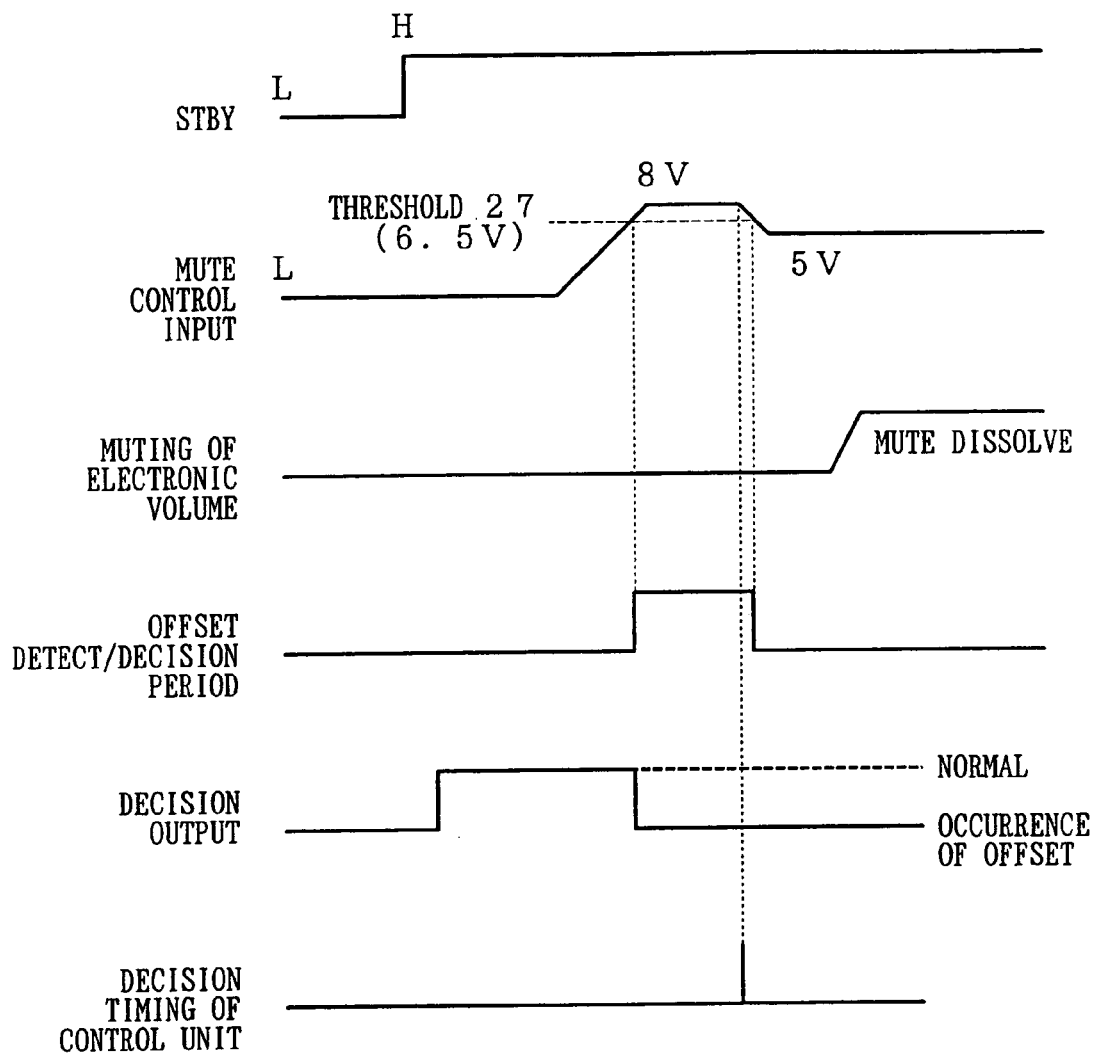
FIG. 8 is a timing chart in the fifth embodiment of the present invention.
Figure 9:
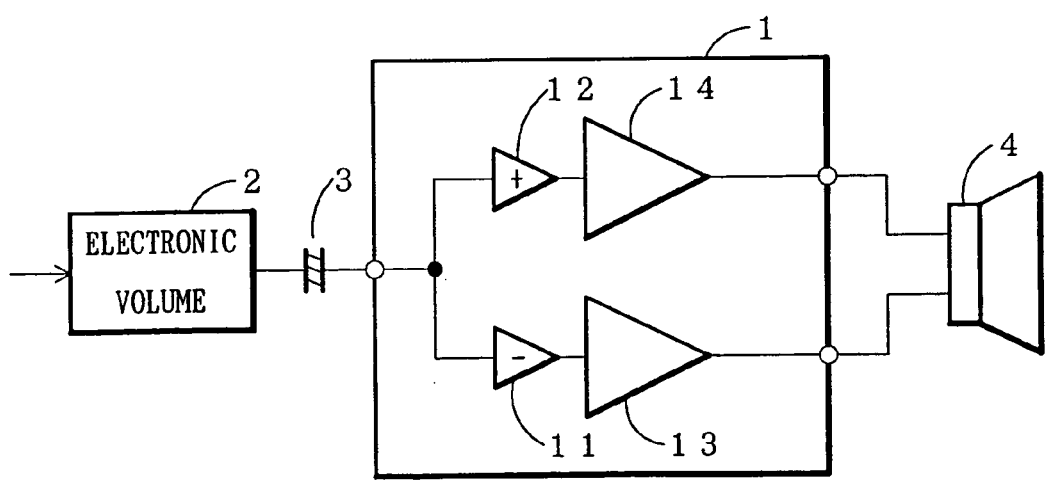
FIG. 9 is a view for explaining a prior art.

Referring to a timing chart of FIG. 8, an explanation will be given of the operation of the configuration shown in FIGS. 6 and 7.

The control unit 5 directs muting to the electronic volume 2. The control unit 5 also turns off the switch 28 and applies 0 V to a diode D1 so that the mute control input terminal is located at the voltage (0 V) in "L" level. Thus, the mute circuit in the integrated circuit 1 is fallen into a muted state.

In this state, when the voltage in the H level is applied to the standby (STBY) input terminal, the standby input terminal is changed from "L" level to "H" level. Thus, the standby state of the integrated circuit 1 is dissolved. Therefore, the switch 23 is turned on through the output from the output circuit 22. As a result, the voltage in the H level from the H generating source 24 is applied to the decision output terminal, and divided by the resistors R1 and R2 so that the resultant voltage is applied to the control unit 5.

When a prescribed time elapses after the standby input terminal becomes "H", the control unit 5 supplies a turn-on signal to the switch 28 and holds the ON state of the switch 28 for a prescribed time (during this time, 0 V is continuously applied to the diode D1). A power supply voltage of 8 V, which has been applied to the one end of the switch 28, is supplied to a time constant circuit composed of a resistor R3 and a capacitor C1 through the switch 28. As a result, the mute control input terminal rises to 8 V.

When a voltage not lower than the mute control voltage (2.5 V) is applied to the mute control input terminal, the muted state of the mute circuit 25 is dissolved. The comparator 26 compares the voltage at the mute control input terminal with a prescribed threshold voltage 27 (which is set at e.g. 6.5 V to satisfy the condition, mute control voltage <threshold voltage 27< power source voltage). If the former is larger than the latter, an execution command signal for executing a detection/decision operation to the differential voltage detection unit 16 and decision unit 20. Therefore, when a voltage of 8 V is applied to the mute control input terminal for a prescribed time, the mute circuit 25 dissolves the muting operation, and in response to the execution command signal from the comparator 26, the detecting/deciding operation of the DC offset voltage is carried out. All this while, the electronic volume 2 maintains the muted state so that no signal is supplied to the power amplifiers 13 and 14.

The detection operation is carried out in the same manner as in the embodiments described above. Namely, whether or not the detected differential voltage is larger than a prescribed value is decided by the decision unit 20. If the answer is "YES", the decided output is supplied to the OR circuit 21. An output from the decision unit 20 of another BTL amplifier apparatus for another channel, which is configured in the same structure as that shown in FIG. 6, is supplied to the OR circuit 21. In the BTL amplifier apparatus having such a multi-channel configuration, when the DC offset voltage is detected for at least one channel, the output from the decision unit 20 is supplied to the output circuit 22 through the OR circuit 21. In response to the decision output, the output circuit 22 turns off the switch 23. Thus, since the H generating source 24 is disconnected from the decision output terminal, the voltage at "L" level is generated at the decision output terminal.

Therefore, while the offset voltage is detected, the control unit 5 takes in the voltage generated at the decision output terminal at a prescribed timing. If the voltage is "H", it is decided that the offset voltage has been generated. If the voltage is "L", it is decided that the offset voltage has not been generated.

Upon completion of the detection/detection period of the offset voltage, the control unit 5 turns off the switch 28. The control unit 5 applies a voltage of 5 V to the diode D1 so that a mute dissolving voltage is applied to the mute control input terminal. Thus, the mute circuit 25 maintains the dissolving of the mute. On the other hand, the control unit 5 issues a mute dissolving command to the electronic volume 2 so that the muted state of the electronic volume 2 is dissolved. Thus, the input signal level-adjusted by the electronic volume 2 is supplied to the power amplifiers 13 and 14.

Where the offset voltage is detected, as described above, the control unit 5 maintains the muted state of the electronic volume, or causes the display unit 6 to indicate a warning. Otherwise, the control unit 5 sets 0 V at the mute control input terminal so that the mute circuit 25 is muted.

FIG. 7 shows a concrete example of the mute circuit 25. In FIG. 7, a power supply voltage +B is selectively supplied to an amplifier 12 or an amplifier 31 by the operation of a switch 30. The output from the amplifier 12 or 29 is connected to the input of the power amplifier 14 by the operation of the switch 31. The switches 30 and 31 are switched simultaneously by the voltage applied to the mute control input terminal. The power amplifiers 13 and 14 are fed back to the inverting amplifiers 11 and 12 through resistors R5 and R7, respectively. A DC bias reference voltage of +B/2 is applied to the amplifier 12 so that the output therefrom appears as a positive or negative voltage in terms of the reference voltage. The non-inverting input of each of the inverting amplifier 11 and amplifier 29 is connected to an AC grounding terminal (AC GND) of the integrated circuit 1.

In the circuit configuration described above, the input signal is supplied to the power amplifiers 13, 14 through the inverting amplifier 11 and amplifier 12, respectively. In this case, when a voltage of 2.5 V or more is applied to the mute control input terminal, the switches 30 and 31 are connected to the side of "Play" in FIG. 7. Thus, the power source voltage of +B (14 V) is applied to the amplifier 12 and the output therefrom is supplied to the power amplifier 14. In this way, the BTL amplifying operation is performed to drive the speaker 4.

In the state where the input signal is not supplied to the integrated circuit 1 also, +B/2 is applied to the one end of a capacitor 3, and a DC voltage has been applied across the capacitor 3. Therefore, when the leak current Ir due to the DC voltage flows though the capacitor 3, it flows along a passage of +B/2 resistor R4→capacitor 3. Since the voltage of +B/2 is the same potential as the AC grounding terminal (AC GND) in terms of DC, a voltage drop of R4×Ir is generated in the amplifier 12. This voltage drop is multiplied by a gain of the power amplifier 14. The resultant voltage appears as an DC offset at the output.

On the other hand, when the mute control input terminal is at 0 V, the switches 30, 31 are changed to the side of "Mute" in FIG. 7. Therefore, the power source voltage +B is supplied to the amplifier 29 and the output therefrom is connected to the input of the power amplifier 13. The reference potential to be applied to the non-inverting input of each of the amplifiers 29 and 12 is that at the AC grounding terminal so that the DC offset voltage is not generated. Even if the leak current flows along the capacitor 3, since the capacitor 3 is not coupled with the amplifier 12 and power amplifier 14, the offset voltage between the outputs from the power amplifiers 13 and 14.

What is claimed is:

1. A BTL amplifying apparatus, comprising:
   two output terminals;
   two power amplifiers for driving a speaker;
   an electric volume;
   a difference voltage detecting unit that detects a differential voltage between the two power amplifiers;
   a control unit that decides whether or not said differential voltage is larger than a prescribed voltage; and
   switches respectively connected between the two output terminals and the two power amplifiers for respectively connecting the two power amplifiers to the two output terminals,
   wherein after the control unit controls the electric volume to mute signals outputted from the electric volume at a prescribed timing, the control unit reads the differential voltage detected by the difference voltage detecting unit, and
   wherein when the control unit decides that the differential voltage is larger than a prescribed voltage, the control unit turns off the switches.

2. The BTL amplifying apparatus as claimed in claim 1, wherein the prescribed timing includes time when the control unit receives a signal indicating that a power switch is turned on, or that a signal source is switched.

3. The BTL amplifying apparatus as claimed in claim 1 further comprising a warning device for giving a warning when the control unit decides that the difference voltage is larger than the prescribed voltage.

* * * * *